(12) United States Patent
Shirasaka

(10) Patent No.: US 7,195,953 B2
(45) Date of Patent: Mar. 27, 2007

(54) METHOD OF MANUFACTURING A SEMICONDUCTOR PACKAGE USING A LEAD FRAME HAVING THROUGH HOLES OR HOLLOWS THEREIN

(75) Inventor: Kenichi Shirasaka, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 10/811,999

(22) Filed: Mar. 30, 2004

(65) Prior Publication Data

US 2004/0195661 A1    Oct. 7, 2004

(30) Foreign Application Priority Data

Apr. 2, 2003    (JP)    ............... 2003-099126

(51) Int. Cl.
*H01L 21/60*    (2006.01)
(52) U.S. Cl. ................ 438/112; 438/123; 257/E21.506
(58) Field of Classification Search ......... 257/666–796
See application file for complete search history.

(56) References Cited

U.S. PATENT DOCUMENTS

| 5,327,008 A | 7/1994 | Djennas et al. |
| 6,208,023 B1 | 3/2001 | Nakayama et al. |
| 6,909,166 B2 * | 6/2005 | Frezza et al. ............... 257/666 |

FOREIGN PATENT DOCUMENTS

| JP | 2-302068 A | 12/1990 |
| JP | 4-27148 A | 1/1992 |
| JP | 4-103154 A | 4/1992 |
| JP | 04-134852 | 5/1992 |
| JP | 4-171855 A | 6/1992 |
| JP | 5-309116 A | 11/1993 |
| JP | 6-334090 A | 12/1994 |
| JP | 07-030043 | 1/1995 |
| JP | 8-125088 A | 5/1996 |
| JP | 10-303358 A | 11/1998 |
| JP | 11-008261 | 1/1999 |
| JP | 11-354705 A | 12/1999 |
| JP | 2002-164497 A | 6/2002 |
| JP | 2002-246528 A | 8/2002 |
| JP | 2002-359336 | 12/2002 |

OTHER PUBLICATIONS

Harper; Electronic Packaging and Interconnection Handbook; 1991; McGraw-Hill, Inc.; New York; pp. 618.*
Korean Office Action dated Dec. 21, 2005 (and English translation of same).

* cited by examiner

*Primary Examiner*—Marcos D. Pizarro
(74) *Attorney, Agent, or Firm*—Dickstein, Shapiro, LLP.

(57) ABSTRACT

A lead frame comprises a stage for mounting a semiconductor chip thereon, a plurality of leads arranged in the periphery of the stage, and a plurality of lead interconnection members (e.g., dam bars) for interconnecting the leads, wherein a plurality of through holes are formed to penetrate through the lead frame in a thickness direction with respect to the leads or the lead interconnection members so as to allow a plurality of cutting lines to pass therethrough, whereby the leads are subjected to cutting and are made electrically independent of each other. A semiconductor package of a QFN type is produced by enclosing the lead frame within a molded resin, from which the leads are partially exposed to the exterior and are subjected to plating and are then subjected to cutting at the cutting lines.

3 Claims, 8 Drawing Sheets

METHOD OF MANUFACTURING A SEMICONDUCTOR PACKAGE USING A LEAD FRAME HAVING THROUGH HOLES OR HOLLOWS THEREIN

BACKGROUND OF THE INVENTION

1. Field of the Invention

This invention relates to semiconductor packages for mounting semiconductor chips using lead frames, which are attached onto circuit boards. This invention also relates to methods for manufacturing semiconductor packages using lead frames.

This application claims priority on Japanese Patent Application No. 2003-99126 and Japanese Patent Application (not yet assigned a number, which claims priority on Japanese Patent Application No. 2003-99126 in Japan), the contents of which are incorporated herein by reference.

2. Description of the Related Art

Conventionally, leads frames are used for semiconductor packages incorporating semiconductor chips. A typical example of the lead frame for use in the conventionally-known semiconductor package is shown in FIG. 13, wherein a lead frame 51 comprises a stage 55 for mounting a semiconductor chip 53, a plurality of leads 57 arranged in the periphery of the stage 55, and dam bars 59 for interconnecting the leads 57. This lead frame 51 is manufactured by performing press working or etching process on a thin metal plate.

The aforementioned lead frame 51 can be used for manufacturing the conventionally-known semiconductor package of a QFN type (i.e., a Quad Flat Non-Leaded package), for example. In this case, the semiconductor chip 53 is bonded onto the surface of the stage 55, wherein pads thereof are electrically connected with the leads 57 via bonding wires 61. Then, as shown in FIG. 14, a molded resin 63 is formed to integrally fix the semiconductor chip 53, the stage 55, the bonding wire 61, and the bonding portion of the lead 57 together. Herein, a backside 57a of the lead 57 forms the same plane together with a backside 63a of the molded resin 63.

A prescribed surface 57b of the lead 57 is exposed to the exterior of the molded resin 63 and is subjected to plating together with the backside 57a of the lead 57, whereby plated films 65 are formed thereon in order to improve solder wettability with respect to the lead 57.

Thereafter, a projecting portion 57c of the lead 57, which projects outwardly from the molded resin 63, is cut out together with a dam bar 59 at a cutting line A, so that the leads 57 are made electrically independent of each other, thus completing the production of the semiconductor package.

The conventionally-known package of a QFP type (i.e., a Quad FlatPack package) is designed such that plated films are formed on the surface and backside of the projecting portion of the lead as well as the adjacent side areas of the leads in order to improve the wettability, wherein the solder is adhered not only to the backside of the lead but also to the side area and surface of the lead.

In the QFP package, the projecting portion of the lead is subjected to half etching so as to form a thinned portion, thus increasing the overall solder adhesion area of the lead, an example of which is disclosed in Japanese Patent No. 3008470.

In the QFN package shown in FIG. 14, the lead 57 is cut out at the cutting line A, whereby a cut surface 57d of the lead 57 lying in the thickness direction is not accompanied with a plating film 65 as shown in FIG. 15, whereas other surfaces of the lead 57 except the cut surface 57d are covered with the molded resin 63 so that they do not join with a solder 67. That is, when a semiconductor package 80 is attached onto a circuit board 71 via the solder 67 as shown in FIG. 15, only a land portion 73 of the circuit board 71 is electrically connected with the backside 57a of the lead 57. This causes difficulty in inspecting the joined state established between the solder 67 and the lead 57 through visual inspection. Hence, there is a problem in that reliability secured for the electrical connection established between the semiconductor package 80 and the circuit board 71 may be reduced.

The aforementioned Japanese patent discloses a method for increasing the overall solder adhesion area with respect to the leads. However, in the QFN package in which the lead 57 is not substantially projected outside of the molded resin 63 so that the other surfaces of the lead 57 adjoining the cut surface 57d are covered with the molded resin 63, this method cannot contribute to enhancement of the joining strength established between the cut surface 57d of the lead and the solder 67; that is, it cannot solve the aforementioned problem.

SUMMARY OF THE INVENTION

It is an object of the invention to provide a semiconductor package that can improve a reliability in terms of the electrical connection with a circuit board.

It is another object of the invention to provide a lead frame for use in the semiconductor package.

It is a further object of the invention to provide a method for manufacturing the semiconductor package.

In a first aspect of the invention, a lead frame, which is produced by processing a thin metal plate, comprises a stage for mounting a semiconductor chip, a plurality of leads arranged in the periphery of the stage, and lead interconnection members (e.g., dam bars) for interconnecting the leads, wherein a through hole is formed in the thickness direction of the lead frame with respect to each of the leads or each of the lead interconnection members. Herein, the lead and its associated portion are subjecting to cutting along a cutting line that is set to pass through the through hole, whereby the leads are made electrically independent of each other.

In the above, after plating is performed on appropriate portions of the leads and/or the lead interconnection members, the leads and/or the lead interconnection members are subjected to cutting, whereby a plated film reliably remains in the interior wall of the through hole that forms the side surface of the lead in its thickness direction. That is, it is possible to increase the overall solder adhesion area with respect to the leads, which can be therefore improved in the joining strength with the solder.

Compared with the lead frame in which a relatively small through hole is formed with respect to each of the leads, the lead frame in which a relatively large through hole is formed in each of the lead interconnection members across the plurality of leads is advantageous because the overall plated area can be increased with respect to the side surfaces of the leads after the lead interconnection members are cut out, and hence, it is possible to easily increase the overall solder adhesion area with respect to the leads.

In a second aspect of the invention, a manufacturing method for a semiconductor package is characterized by comprising a lead frame forming step for forming a lead frame by processing a thin metal plate so as to provide a stage, a plurality of leads arranged in the periphery of the stage, and a plurality of lead interconnection members (e.g., dam bars) for interconnecting the leads; a chip mounting step for bonding a semiconductor chip onto the stage of the lead frame and for wiring the semiconductor chip with the leads; a molding step for forming a molded resin for integrally fixing the stage, semiconductor chip, and leads therein; a plating step for performing plating on prescribed surfaces of the leads that are exposed to the exterior of the molded resin; and a cutting step for cutting the leads at a cutting line (or cutting lines) so that the leads are made electrically independent of each other. There is further provided a through hole forming step, which is performed at the appropriate timing in the time period between the lead frame forming step and the plating step, for forming a through hole penetrating through the lead frame in its thickness direction and allowing the cutting line to pass therethrough with respect to each of the leads. Herein, the through hole can be elongated and is formed in each of the lead interconnection members across the leads so as to allow the cutting lines to pass therethrough.

In the above, after the leads and/or the lead interconnection members are subjected to cutting at the cutting lines, plated films reliably remain in the interior walls of the through holes that form the side surfaces of the leads in thickness direction. Hence, it is possible to easily increase the overall solder adhesion area with respect to the leads, which can be therefore improved in the joining strength with the solder.

In the semiconductor package, the leads are partially exposed to the exterior of the molded resin, wherein the side surface of the exposed portion of the lead in its thickness direction provides a plated surface and a cut surface that adjoins the plated surface and that makes the adjoining leads to be electrically independent of each other. Due to the formation of the plated surface on the side surface of the lead exposed from the molded resin, it is possible to increase the solder adhesion area with respect to the lead, which is thus improved in the joining strength with the solder.

In addition, the 'plated' backside of the lead adjacent to the plated surface on the side surface of the lead forms the same plane together with the lower surface of the molded resin, whereby when the semiconductor package is mounted on the circuit board in such a way that the lower surface is placed opposite to the surface of the circuit board, it is possible to reduce the height dimensions of the semiconductor package measured from the surface of the circuit board; in short, it is possible to reduce the thickness dimensions of the semiconductor package.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

Figure 1:
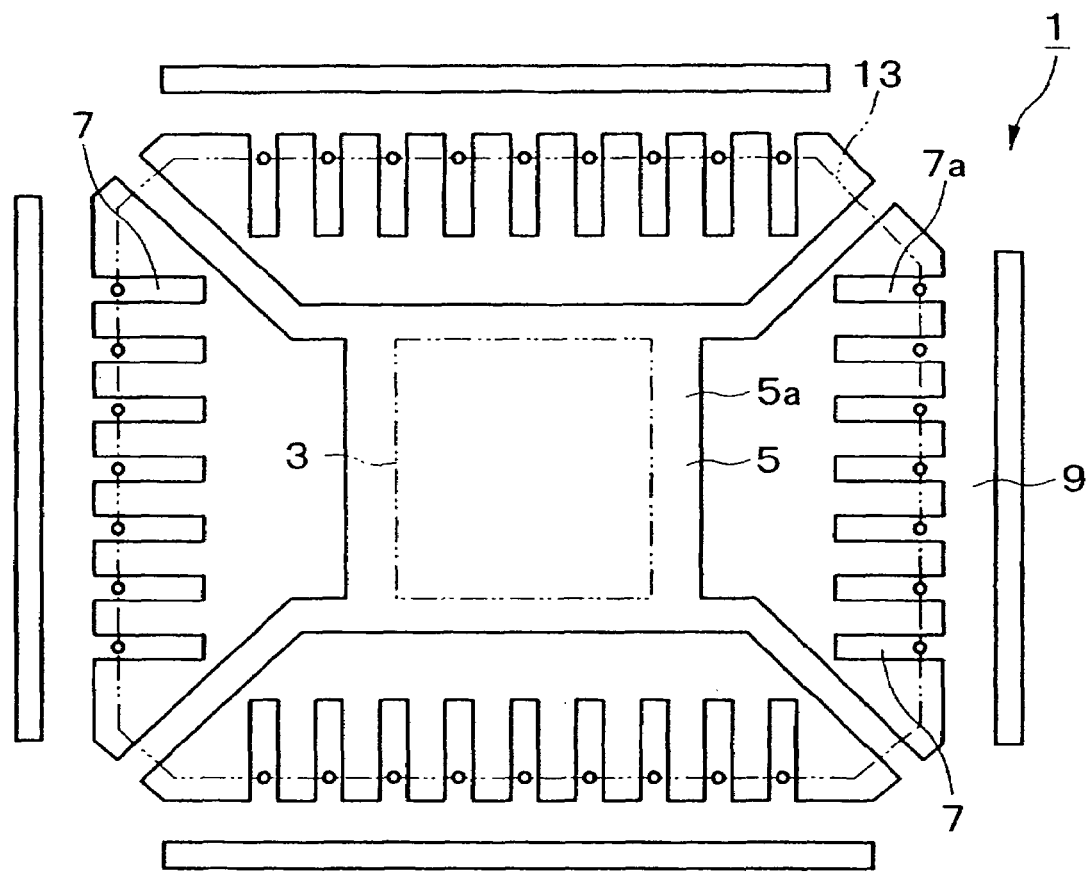
FIG. 1 is a plan view showing a lead frame for use in a semiconductor package in accordance with a preferred embodiment of the invention.
Figure 2:
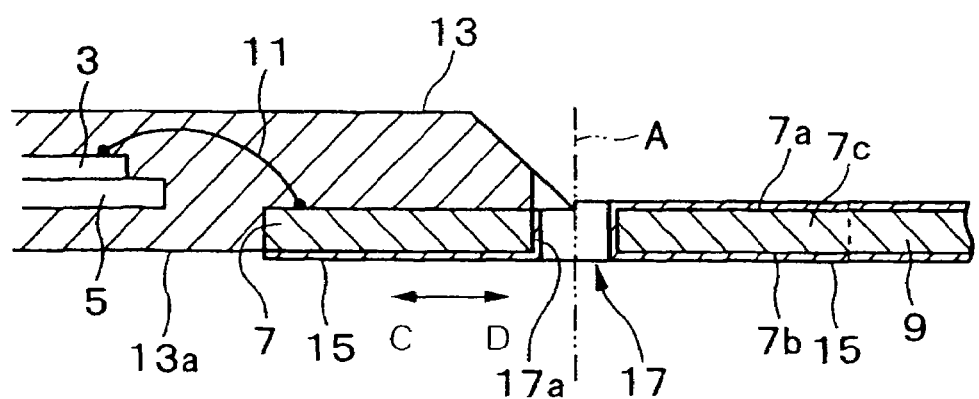
FIG. 2 is an enlarged cross sectional view showing essential parts of the semiconductor package, wherein a projecting portion of a lead is cut out along a cutting line A.

This invention will be described in further detail by way of examples with reference to the accompanying drawings.

The outline of a manufacturing method for a semiconductor package according to a preferred embodiment of the invention will be described with reference to FIGS. 1, 2, 3A, and 3B.

At first, a thin metal plate made of copper and the like is subjected to one of or both of press working and etching process, thus producing a lead frame 1 (see FIG. 1) comprising a stage 5 for mounting a semiconductor chip 3, a plurality of leads 7 arranged in the periphery of the stage 5, and dam bars (i.e., lead interconnecting members) for interconnecting the leads 7.

In the above, a plurality of through holes 17 penetrating through the lead frame 1 are simultaneously formed with respect to the leads 7 respectively due to the press working and/or the etching process, wherein the through holes 17 are aligned along with the arrangements of the leads 7.

Next, the semiconductor chip 3 is bonded onto a surface 5a of the stage 5; then, pads of the semiconductor chip 3 are electrically connected with the leads 7 respectively via metal bonding wires 11. Herein, the bonding position of the lead 7 bonded with the bonding wire 11 is located on a prescribed surface 7a of the lead 7, which is shifted inwardly in position from the through hole 17 towards the stage 5.

The aforementioned lead frame 1 is arranged in a metal mold (not shown), into which a melted resin is injected so as to form a molded resin 13 (see FIG. 2) that integrally fixes the semiconductor chip 3, the stage 5, the bonding wire 11, and the bonding portion of the lead 7 at prescribed positions.

In the above, a backside 13a of the molded resin 13 forms the same plane together with a backside 7b of the lead 7, wherein a prescribed side surface of the molded resin 13 in its thickness direction lies along a cutting line A for the lead, which will be described later. That is, the prescribed side surface of the molded resin 13 lies at a prescribed position at which the overall length of the through hole 17, which is formed in a longitudinal direction (i.e., C-D directions) of the lead 7, is reduced to a half. The molded resin 13 is formed to prevent a resin from being introduced into the through hole 17.

After the formation of the molded resin 13, a surface 7a and a backside 7b of the lead 7, which are exposed to the exterior of the molded resin 13, and the interior wall of the through hole 17 are subjected to plating, thus forming plated films 15.

Thereafter a projecting portion 7c of the lead 7, which is projected outside of the prescribed side surface of the molded resin 13 in the direction D, is cut out at the cutting line A together with the dam bar 9, so that the leads 7 are made electrically independent of each other, thus completing the production of the semiconductor package.

Figure 3A:
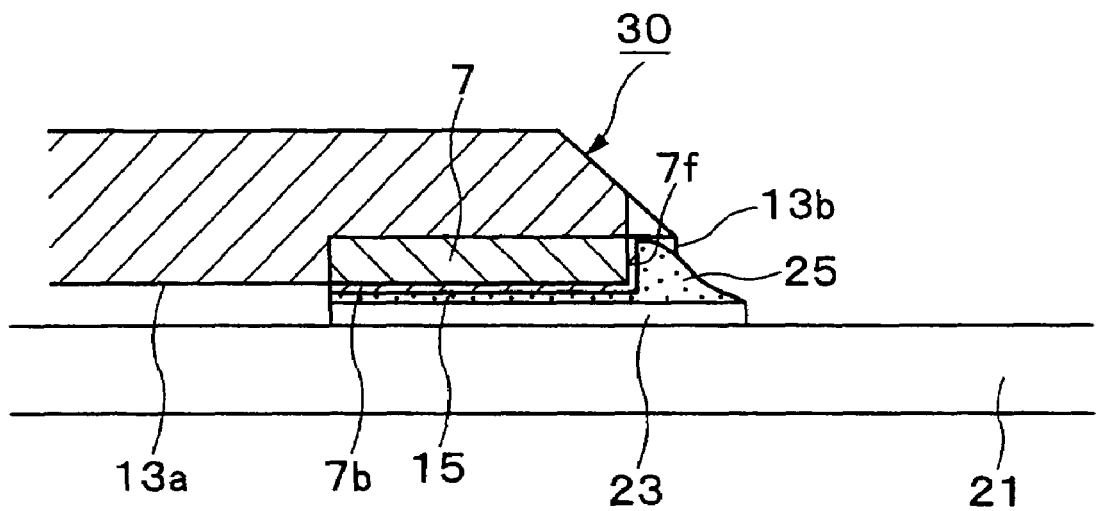
FIG. 3A is an enlarged cross sectional view showing essential parts of the semiconductor package that is attached onto a circuit board.
Figure 3B:
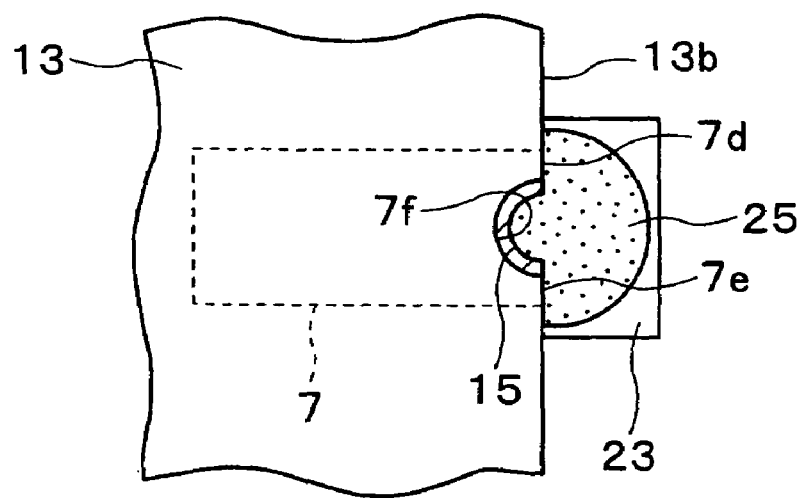
FIG. 3B is an enlarged plan view showing prescribed parts of the semiconductor package shown in FIG. 3A.

As a result, it is possible to produce a semiconductor package 30 of a QFN type as shown in FIG. 3A, wherein the lead 7 is not projected outside of a prescribed side surface 13b of the molded resin 13. In the semiconductor package 30, a side surface 7d of the lead 7 in its thickness direction (see FIG. 3B) that is exposed outwardly is formed by cutting the lead 7 at the cutting line A. Specifically, the side surface 7d of the lead 7 comprises a cut surface 7e, which forms the same plane as the side surface 13b of the molded resin 13, and a concave portion (or a plated surface) 7f that forms a part of an interior wall 17a of the through hole 17, wherein a plated film 15 is formed on the concave portion 7f.

When the semiconductor package 30 is attached onto a circuit board 21, a lower surface 13a of the molded resin 13 is placed opposite to the circuit board 21, wherein each of the leads 7 is electrically connected with a land portion 23 of the circuit board 21 via a solder 25. In this state, the solder 25 joins the backside 7b of the lead 7 and the concave portion 7f.

According to the aforementioned method for manufacturing the semiconductor package 30, the lead frame 1 is formed in such a way that the through holes 17 are formed with respect to the leads 7; then, it is subjected to plating. Hence, by cutting each of the leads 7 at the cutting line A, it is possible to easily produce the semiconductor package 30 in which the plated film 15 is formed on the concave portion 7f of the side surface 7d of the lead 7.

Due to the formation of the plated films 15 on the concave portion 7f of the side surface 7d forming the tip end of the lead 7 as well as the backside 7b of the lead 7, it is possible to noticeably improve wettability, and it is possible to increase the overall adhesion area of the solder 25 with respect to the lead 7; hence, it is possible to noticeably improve the joining strength established between the lead 7 and the solder 25. Under the state where the semiconductor package 30 is attached onto the circuit board 21, the plated film 15 formed on the concave portion 7f is exposed outwardly and upwardly, which makes it easy for a human inspector to perform visual inspection on the joined state between the lead 7 and the solder 25. Therefore, it is possible to improve the reliability in establishing electrical connection between the lead 7 and the land portion 23 of the circuit board 21 when the semiconductor package 30 is attached onto the circuit board 21.

The aforementioned semiconductor package 30 is advantageous in that it is possible to reduce height dimensions measured from the surface of the circuit board 21 when the semiconductor package 30 is attached onto the circuit board 21 because the backside 7b of the lead 7 forms the same plane together with the lower surface 13a of the molded resin 13. In short, it is possible to noticeably reduce the overall thickness of the semiconductor package 30.

Figure 4:
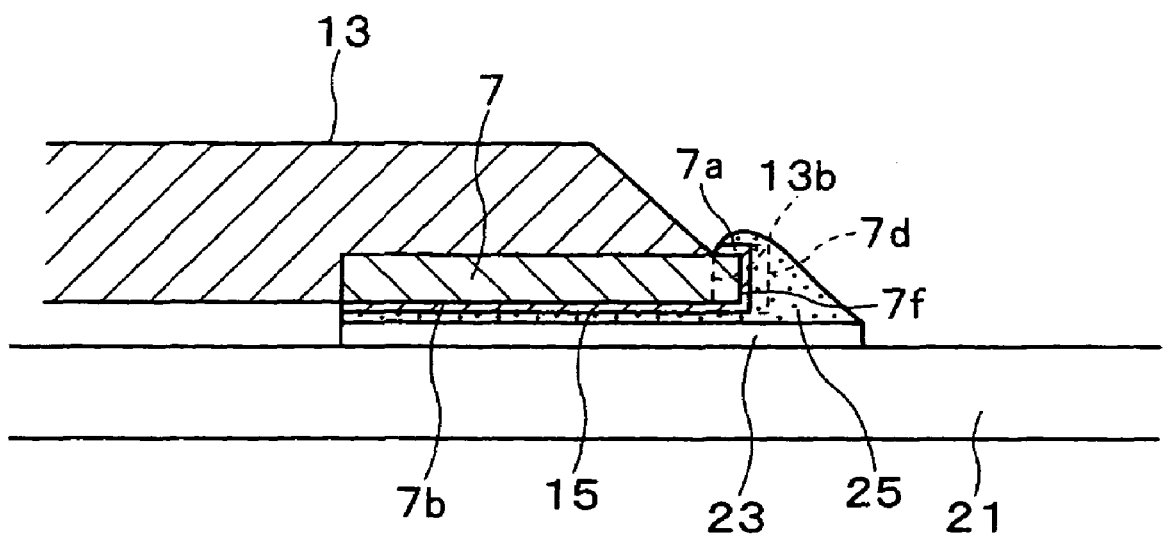
FIG. 4 is an enlarged cross sectional view showing a modified example of the semiconductor package shown in FIGS. 3A and 3B.

The present embodiment is designed such that the cut surface 7e of the lead 7 is located in the same plane of the side surface 13b of the molded resin 13. Of course, this invention is not necessarily limited to the present embodiment, which can be modified such that as shown in FIG. 4, the tip end of the lead 7 is partially projected outside of the side surface 13b of the molded resin 13. In this case, the plated film 15 can remain on the surface 7a of the lead 7 that is exposed to the exterior of the molded resin 13. That is, when the semiconductor package 30 is attached onto the circuit board 21, it is possible to join the solder 25 with the backside 7b of the lead 7, the concave portion 7f, and the surface 7a; hence, it is possible to further improve the reliability in establishing electrical connection between the lead 7 and the land portion 23 of the circuit board 21.

Figure 5:
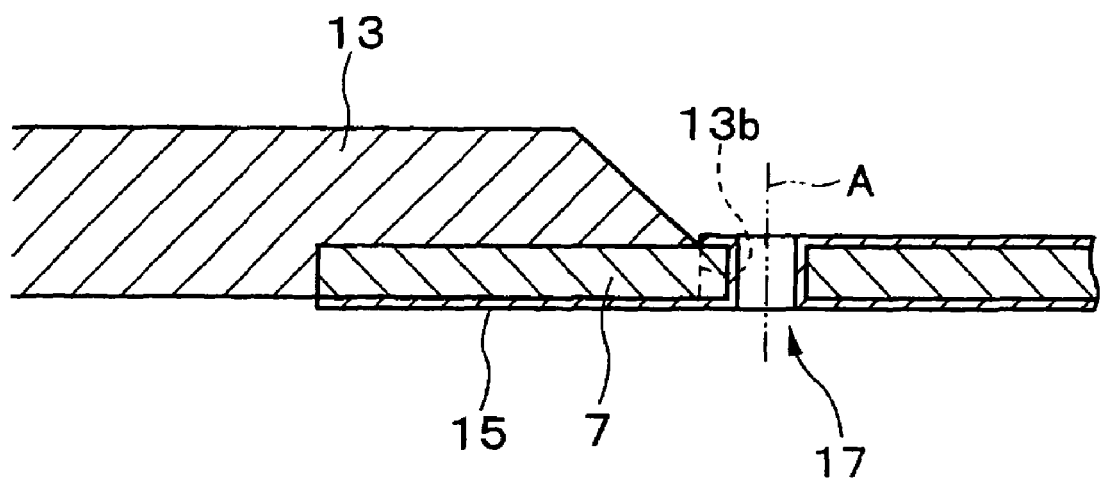
FIG. 5 is an enlarged cross sectional view showing the modified example of the semiconductor package before a cutting process.

In the case of FIG. 4, the through hole 17 should be formed outwardly from the side surface 13b of the molded resin 13 as shown in FIG. 5. Alternatively, the through hole 17 should be enlarged in dimensions in a direction as it separates off from the side surface 13b of the molded resin 13.

The present embodiment is designed such that the lead 7 is subjected to cutting at a prescribed cutting position at which the length of the through hole 17 lying in the longitudinal direction of the lead 7 is reduced to a half. Of course, this invention is not necessarily limited to the present embodiment, which can be modified such that the cutting position can be set at any position of the through hole 17.

The through hole 17 is not necessarily formed with respect to each lead 7. That is, the through hole 17 can be formed at a prescribed position of the dam bar 9 interconnecting the leads 7.

Figure 6:
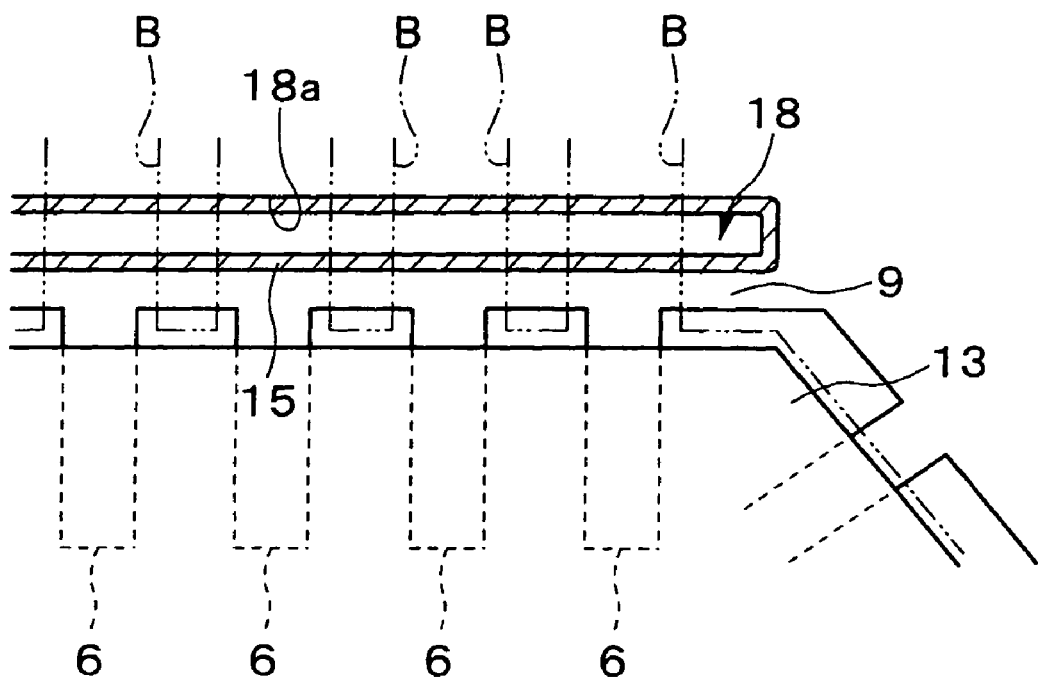
FIG. 6 is an enlarged plan view showing a modified example of a semiconductor package in which a through hole is formed in a dam bar across a plurality of leads.
Figure 7:
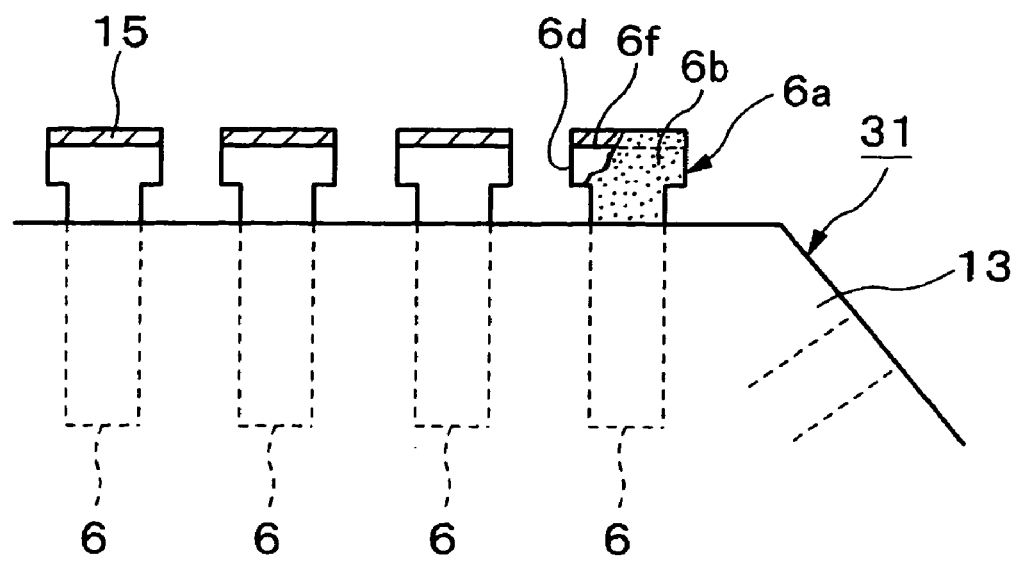
FIG. 7 is an enlarged plan view showing the semiconductor package that is subjected to cutting so that the leads are made electrically independent of each other.

That is, as shown in FIG. 6, in the formation of the lead frame, an elongated through hole 18 is formed in an alignment direction of leads 6 across a plurality of the leads 6, wherein the leads 6 including the interior wall of the through hole 18 and the dam bar 9 are subjected to plating; then, the dam bar 9 is subjected to cutting at cutting lines B. Thus, it is possible to produce a semiconductor package 31 as shown in FIG. 7 in which the leads 6 are made electrically independent of each other.

In the aforementioned semiconductor package 31, each of side surfaces 6a of the leads 6 in their thickness directions is constituted by a plated surface 6f forming the tip end of the lead 6 on which a plated film 15 is formed, and a cut surface 6d that adjoins the plated surface 6f and is positioned opposite to the other adjacent lead 6, wherein a prescribed surface 6b adjoining the side surface 6a of the lead 6 is subjected to plating as well.

The aforementioned semiconductor package 31 is characterized by forming a relatively large through hole 18, which is larger than the foregoing through hole 17 formed with respect to each lead 7; hence, it is possible to easily increase the total area of the plated surface 6f of the lead 6. Thus, it is possible to reliably improve the joining strength between the solder and the lead 6 by further increasing the solder adhesion area with respect to the lead 6.

Figure 8:
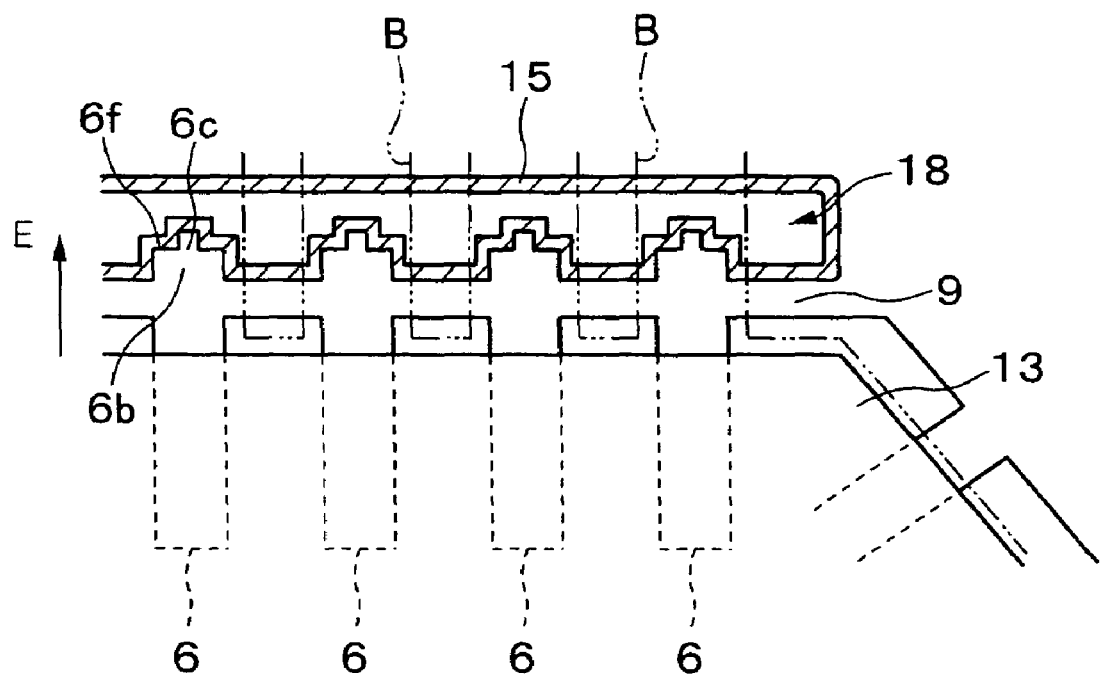
FIG. 8 is an enlarged plan view showing a modified example of a semiconductor package in which the tip end of each lead is projected inside of an elongated through hole formed in a dam bar and is accompanied with a further projecting portion.

When the through hole 18 is formed in the dam bar 9, it is possible to form the tip ends of the leads 6 of the semiconductor package 31 in advance. That is, it is possible to modify each of the leads 6 as shown in FIG. 8 such that each lead 6 has a projecting portion 6*b*, which is projected inside of the through hole 18 in the longitudinal direction (i.e., a direction E) thereof, wherein a further projecting portion 6*c* is formed from the projecting portion 6*b* of the lead 6.

Incidentally, the overall area of the plated surface 6*f* is not necessarily increased by forming the further projecting portion 6*c* further projected inside of the through hole 18. Instead, it is possible to form a hollow (or a recess) at the projecting portion 6*b* forming the tip end of the lead 6.

In the modified example of the present embodiment, the through hole 18 is formed across a plurality of leads 6 in the alignment direction of the leads 6, which is not restricted in this invention. That is, this invention requires that a through hole be formed at the prescribed position allowing the cutting line to pass therethrough in order to make the adjacent leads 6 electrically independent of each other. For instance, it is possible to form a through hole on the cutting line B passing between the adjacent leads 6.

In the present embodiment and its modifications, the through hole(s) is formed simultaneously with the formation of the lead frame, which is not restricted in this invention. That is, this invention requires that the through hole be formed within a time period between the formation of the lead frame and the timing to perform plating. Specifically, the through holes can be formed simultaneously with the formation of the molded resin 13. Due to the provision of the through hole(s), it is possible to increase the overall area for the plating, and it is possible to reduce the overall cutting area for making the leads electrically independent of each other. It is therefore possible to provide an effect in which the semiconductor package can be produced with ease.

Figure 9:
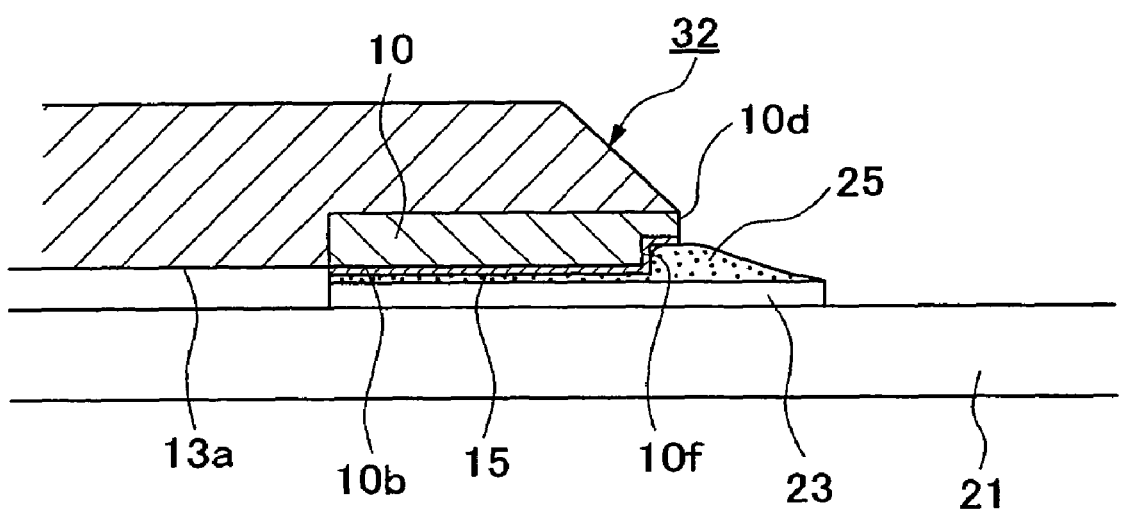
FIG. 9 is an enlarged cross sectional view showing a modified example of a semiconductor package.

In the present embodiment and its modifications, the plated surface 6*f* and the concave portions 7*f* and 8*f*, which are subjected to plating, are formed in the thickness directions of the leads 6–8, which is not restricted in this invention. For example, the present embodiment can be modified as shown in FIG. 9 such that a part of a side surface 10*d* of a lead 10 located in proximity to a backside 10*b* is subjected to plating, thus forming a plated surface 10*f*. When such a semiconductor package 32 shown in FIG. 9 is attached onto the circuit board 21, the solder 25 can join the plated surface 10*f* in addition to the backside 10*b* of the lead 10; therefore, it is possible to improve the reliability in establishing the electrical connection between the lead 10 and the land portion 23 of the circuit board 21.

Figure 10:
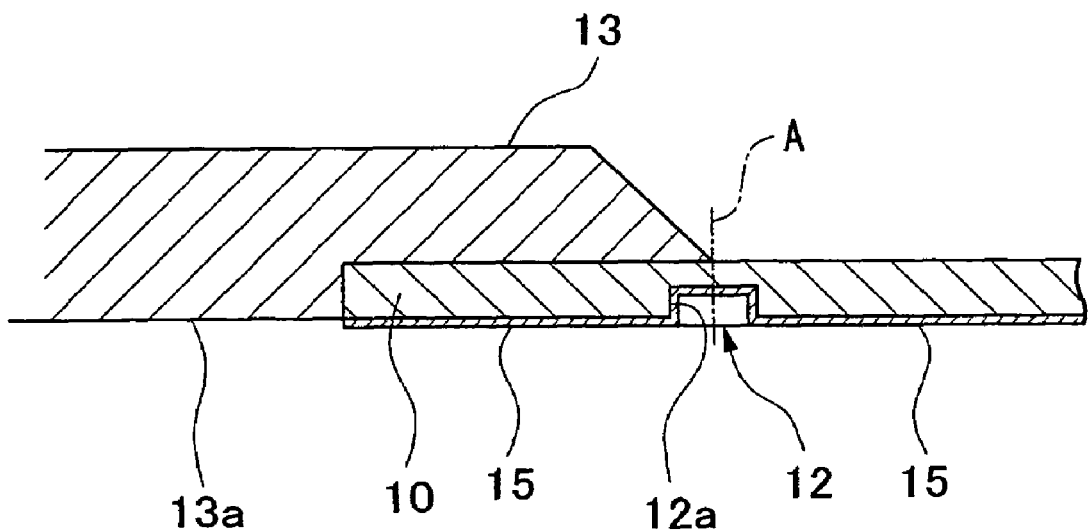
FIG. 10 is an enlarged cross sectional view showing a modified example of a semiconductor package before a cutting process.

In the above, the semiconductor package 32 can be modified as shown in FIG. 10 such that instead of forming the foregoing through holes 17 and 18 penetrating through the lead frame, a hollow portion 12 should be formed by etching or machining on the backside 10*b* of the lead 10 in association with the cutting line A, which is set to make the adjacent leads 10 electrically independent of each other. Herein, an interior wall 12*a* of the hollow portion 12 is subjected to plating, thus forming the aforementioned plated surface 10*f*.

Figure 11:
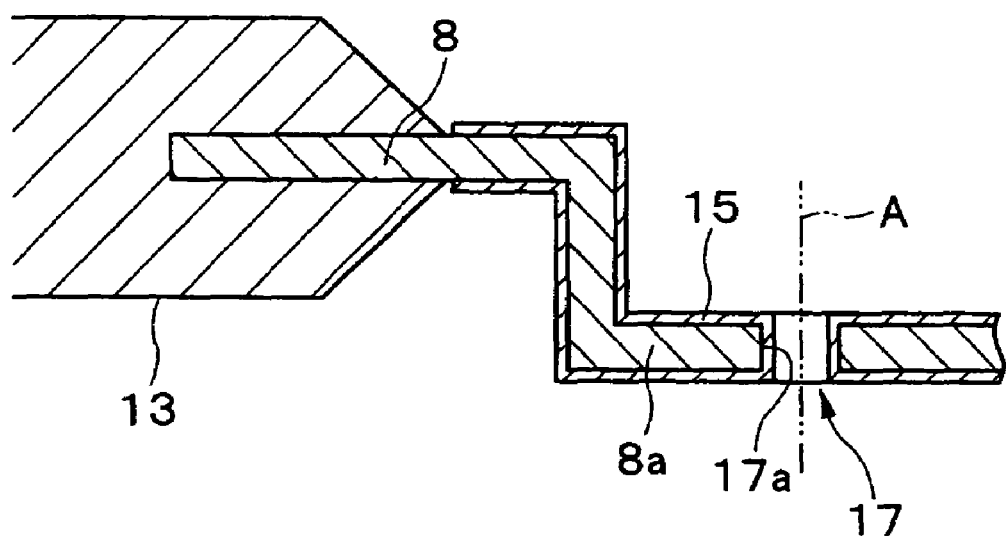
FIG. 11 is an enlarged cross sectional view showing a modified example of a semiconductor package before a cutting process.
Figure 12:
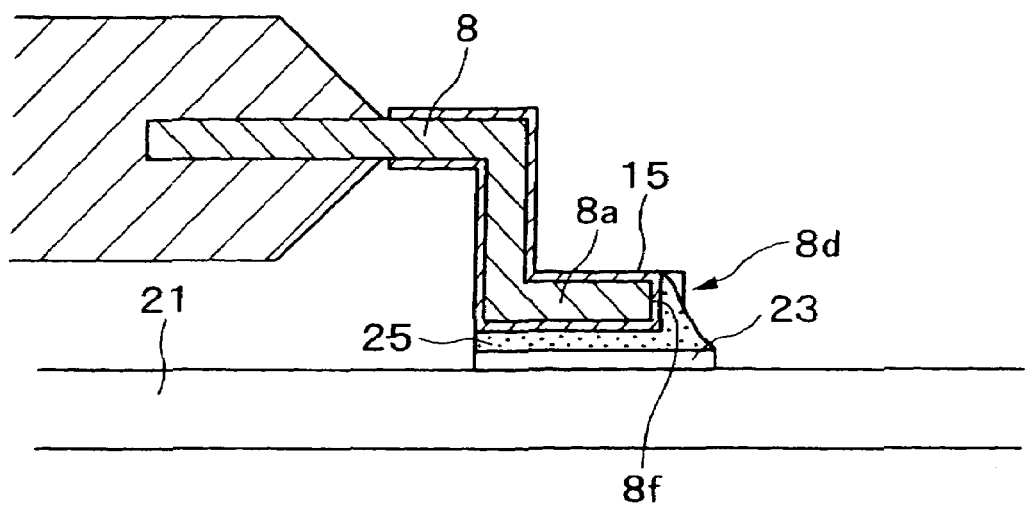
FIG. 12 is an enlarged cross sectional view showing the semiconductor package shown in FIG. 11 that is attached onto a circuit board.
Figure 13:
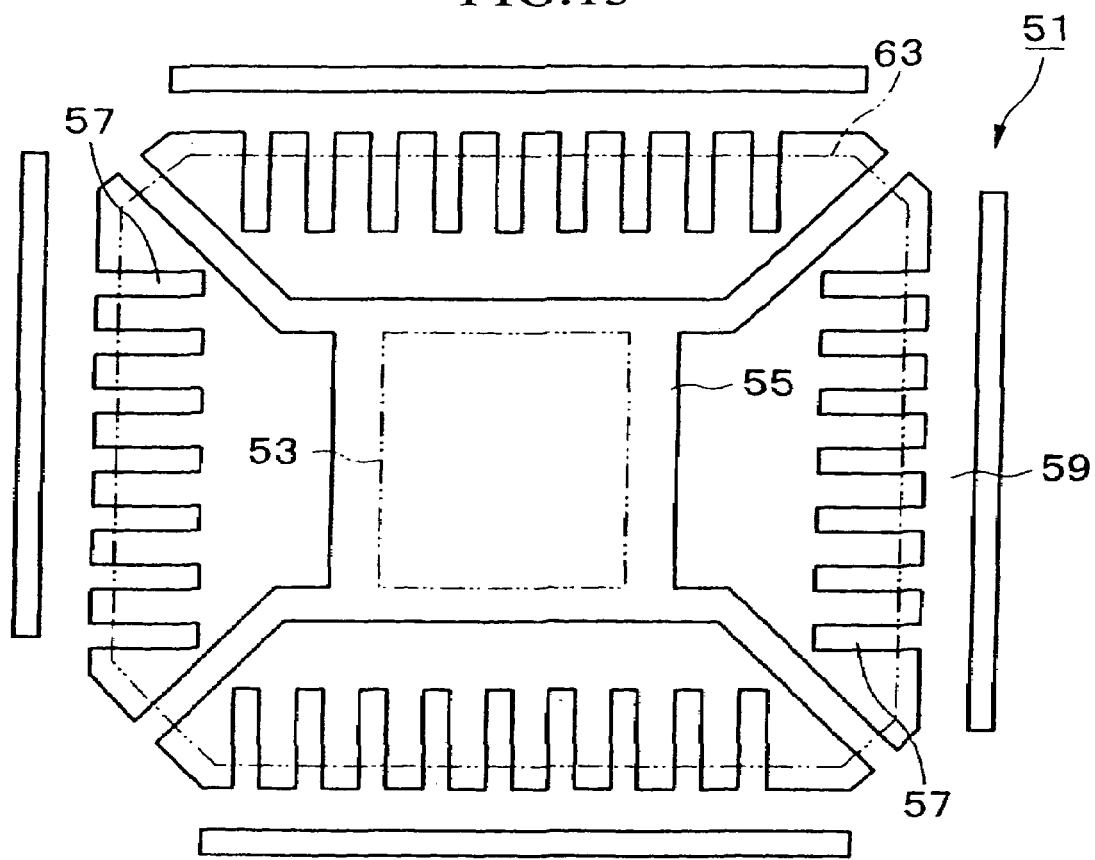
FIG. 13 is a plan view showing a conventionally-known example of a lead frame for use in a semiconductor package.
Figure 14:
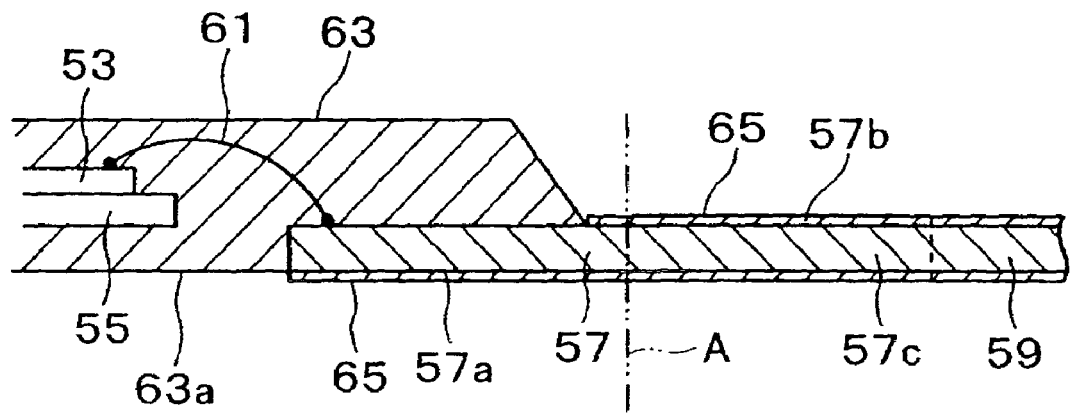
FIG. 14 is an enlarged cross sectional view showing essential parts of the semiconductor package enclosing the lead frame shown in FIG. 13 in which a projecting portion of a lead is subjected to cutting at a cutting line A.
Figure 15:
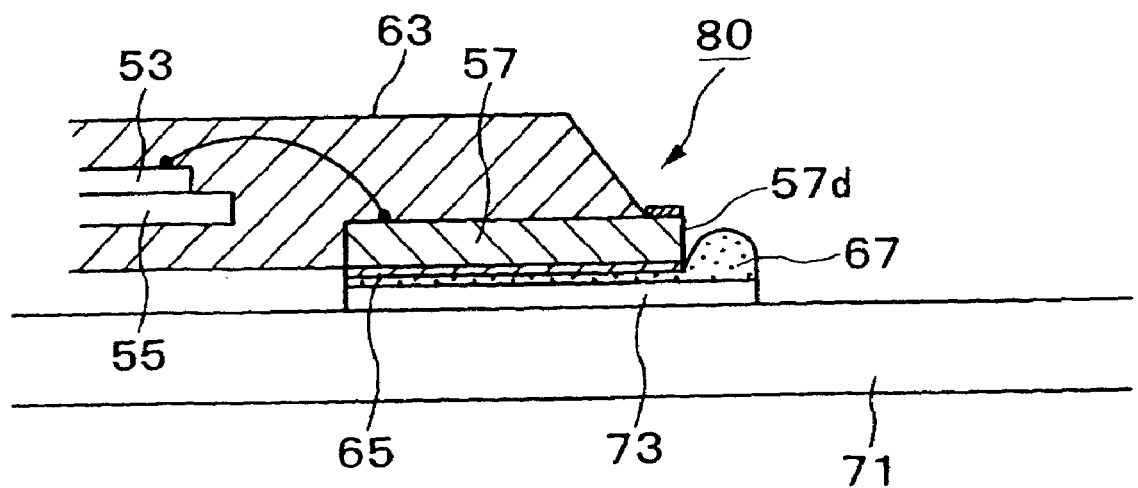
FIG. 15 is an enlarged cross sectional view showing the semiconductor package attached onto a circuit board.

Each of the aforementioned semiconductor packages 30–32 is constituted as the QFN type, which is not restricted in this invention when the semiconductor package is not necessarily reduced in thickness. That is, each of them can be constituted as the QFP type providing the aforementioned leads 8, which are projected outside of the molded resin 13. For example, it is possible to partially modify the aforementioned semiconductor package as shown in FIG. 11 such that the through hole 17 is formed on a joining portion 8*a* of the lead 8 joining the solder 25, wherein the interior wall 17*a* of the through hole 17 is subjected to plating; then, the lead 8 is subjected to cutting at a cutting line A. Thus, it is possible to produce a semiconductor package as shown in FIG. 12 in which a concave portion 8*f* forming a side surface 8*d* of the joining portion 8*a* of the lead 8 joins the solder 25, whereby it is possible to further improve the reliability in establishing the electrical connection between the lead 8 and the land portion 23 of the circuit board 21.

As described heretofore, this invention has a variety of effects and technical features, which will be described below.

(1) According to this invention, a lead frame is designed such that a through hole is formed with respect to a lead or a lead interconnection member (e.g., a dam bar), whereby it is possible to improve the joining strength between the lead and the solder. Herein, the lead frame mounting a semiconductor chip is enclosed in a molded resin so as to produce a semiconductor package that is attached onto a circuit board, wherein it is possible to improve the reliability with respect to the electrical connection established between the lead and the land portion of the circuit board.

(2) When the lead frame is designed such that the through hole is elongated and is formed in the lead interconnection member, it is possible to improve the joining strength between the lead and the solder compared with the lead frame in which a relatively small through hole is formed with respect to each lead.

(3) After formation of the through hole(s), a plating process is performed to form plated films at appropriate areas of the leads substantially enclosed in a molded resin. Herein, plating is performed on the side portions of the leads that are exposed to the exterior of the molded resin. In addition, the surfaces of the leads are formed in the same plane together with the lower surface of the molded resin, whereby it is possible to noticeably reduce the overall thickness of the semiconductor package.

As this invention may be embodied in several forms without departing from the spirit or essential characteristics thereof, the present embodiment and its modified examples are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A manufacturing method for a semiconductor package comprising the steps of:

forming a lead frame by processing a thin metal plate, wherein the lead frame comprises a stage for mounting a semiconductor chip thereon, a plurality of groups of leads arranged in a periphery of the stage, and a plurality of lead interconnection members for interconnecting a plurality of leads in each group of the leads respectively;

mounting the semiconductor chip on the stage of the lead frame via bonding, wherein the semiconductor chip is wired with the plurality of leads;

forming a molded resin for integrally fixing the semiconductor chip, the stage, and the leads therein, the molded resin having side surfaces around a periphery thereof;

plating prescribed surfaces of the leads that are exposed to an exterior of the molded resin; and cutting the plurality of leads at a plurality of cutting lines so that the plurality of leads are made electrically independent of each other, and so that the plurality of leads do not extend beyond the side surfaces of the molded resin, wherein a through hole is formed in each lead in a thickness direction of the lead frame so as to allow the plurality of cutting lines to pass therethrough, and wherein the through holes are formed at a selected timing within a prescribed time period counting from a timing of forming the lead frame to a timing of plating the leads.

2. The manufacturing method for a semiconductor package according to claim 1, wherein the through hole is formed by etching.

3. A manufacturing method for a semiconductor package comprising the steps of:

forming a lead frame by processing a thin metal plate, wherein the lead frame comprises a stage for mounting a semiconductor chip thereon, a plurality of groups of leads arranged in a periphery of the stage, and a plurality of lead interconnection members for interconnecting a plurality of leads in each group of the leads respectively;

mounting the semiconductor chip on the stage of the lead frame via bonding, wherein the semiconductor chip is wired with the plurality of leads;

forming a molded resin for integrally fixing the semiconductor chip, the stage, and the leads therein, the molded resin having side surfaces around a periphery thereof;

plating prescribed surfaces of the leads that are exposed to an exterior of the molded resin; and cutting the plurality of leads at a plurality of cutting lines so that the plurality of leads are made electrically independent of each other, and so that the plurality of leads do not extend beyond the side surfaces of the molded resin, wherein at least one hollow is formed in the lead frame in a thickness direction thereof so as to allow the plurality of cutting lines to pass therethrough, and wherein the hollow is formed at a selected timing within a prescribed time period counting from a timing of forming the lead frame to a timing of plating the leads.

* * * * *